(12) United States Patent
Saxler (10) Patent No.: US 8,628,622 B2
(45) Date of Patent: Jan. 14, 2014

(54) GAS DRIVEN ROTATION APPARATUS AND METHOD FOR FORMING CRYSTALLINE LAYERS

(75) Inventor: Adam William Saxler, Durham, NC (US)

(73) Assignee: Cree, Inc., Durham, NC (US)

( * ) Notice: Subject to any disclaimer, the term of this patent is extended or adjusted under 35 U.S.C. 154(b) by 1212 days.

(21) Appl. No.: 11/224,458

(22) Filed: Sep. 12, 2005

(65) Prior Publication Data

US 2007/0062455 A1 Mar. 22, 2007

(51) Int. Cl.
*C23C 16/00* (2006.01)

(52) U.S. Cl.
USPC .... 118/730; 118/715; 156/345.33; 427/248.1

(58) Field of Classification Search
USPC ............ 118/715, 730; 156/345.33; 427/248.1
See application file for complete search history.

(56) References Cited

U.S. PATENT DOCUMENTS

| | | | | |
|---|---|---|---|---|
| 4,860,687 A | * | 8/1989 | Frijlink | 118/500 |
| 4,922,462 A | * | 5/1990 | Ikegawa et al. | 365/113 |
| 4,961,399 A | | 10/1990 | Frijlink | |
| 4,976,217 A | | 12/1990 | Frijlink | |
| 5,027,746 A | | 7/1991 | Frijlink | |
| 5,108,540 A | | 4/1992 | Frijlink | |
| 5,155,062 A | * | 10/1992 | Coleman | 117/88 |
| 5,226,383 A | | 7/1993 | Bhat | |
| 6,001,175 A | * | 12/1999 | Maruyama et al. | 117/102 |
| 6,005,226 A | * | 12/1999 | Aschner et al. | 219/390 |
| 6,039,812 A | * | 3/2000 | Ellison et al. | 118/725 |
| 6,183,565 B1 | | 2/2001 | Granneman et al. | |
| 6,569,250 B2 | * | 5/2003 | Paisley et al. | 118/730 |
| 6,797,069 B2 | | 9/2004 | Paisley et al. | |
| 6,811,614 B2 | | 11/2004 | Kappeler et al. | |
| 2003/0209719 A1 | | 11/2003 | Nakamura et al. | |
| 2004/0060518 A1 | | 4/2004 | Nakamura et al. | |
| 2004/0175939 A1 | | 9/2004 | Nakamura et al. | |
| 2004/0198153 A1 | * | 10/2004 | Halpin et al. | 446/259 |

FOREIGN PATENT DOCUMENTS

JP 2002-164415 * 6/2002

OTHER PUBLICATIONS

Arai et al (Journal of Crystal Growth 170 (1997) 88-91).*
Takayuki Arai et al., Highly Uniform Growth in a Low-pressure MOVPE Multiple Wafer System; Journal of Crystal Growth 170(1997) 88-91; Elsevier Science B.V.

* cited by examiner

*Primary Examiner* — Jeffrie R Lund
*Assistant Examiner* — Satish Chandra
(74) *Attorney, Agent, or Firm* — Steven B. Phillips; Moore & Van Allen, PLLC

(57) ABSTRACT

A gas driven apparatus and method that can be useful for growing crystalline materials are provided. The gas driven rotation apparatus can include one or more rotatable substrate support members, each of which can be configured to support at least one substrate having a growth surface oriented in a downwardly facing position. The gas driven rotation apparatus can further include one or more drive gas channels adapted to direct the flow of a drive gas to rotate the substrate support member. One or more substrates can be positioned in the apparatus so that the growth surface of each substrate is downwardly oriented. A drive gas can flow through the drive gas channel to rotate the substrate. During rotation, reactant gases can be introduced to contact the downwardly facing growth surface, and epitaxial layers of a crystalline material can thereby be grown in a downward direction.

37 Claims, 4 Drawing Sheets fig. 3A.

GAS DRIVEN ROTATION APPARATUS AND METHOD FOR FORMING CRYSTALLINE LAYERS

BACKGROUND OF THE INVENTION

The present invention relates to an apparatus and method useful for the vapor deposition of materials, and more particularly to an apparatus and method useful for the production of crystalline material using gas driven substrate rotation.

Materials such as silicon (Si) and gallium arsenide (GaAs) have found wide application in semiconductor devices. These materials, however, may not be well suited for higher power and higher frequency applications because of their relatively small bandgaps (e.g., 1.12 eV for Si and 1.42 eV for GaAs at room temperature) and/or relatively small breakdown voltages.

In view of increased interest in high power and high frequency applications and devices, attention has turned to wide bandgap semiconductor materials such as silicon carbide (SiC, with a bandgap of 2.996 eV for alpha SiC at room temperature) and the Group III nitrides, including gallium nitride (GaN, with a bandgap of 3.36 eV at room temperature). SiC and GaN also exhibit high breakdown fields of about 3 MV/cm, thus enabling such materials to withstand high power levels. In addition, GaN exhibits excellent electron-transport properties, which enables it to operate at high frequencies.

SiC and GaN materials can be prepared using vapor phase deposition techniques as known in the art, in which reactant gases, typically diluted in a carrier gas such as hydrogen, are introduced into a system to form a crystalline material in epitaxial layers upon an appropriate substrate. Various vapor phase deposition techniques have been further developed for the production of epitaxial layers of GaN in view of the difficulties associated with the vapor transport of gallium and other Group III components in non-organic form. For example, in MOCVD (metal-organic chemical vapor deposition) and OMVPE (organo-metallic vapor phase epitaxy), GaN is deposited from ammonia (as the nitrogen source) and organometallic compounds such as trimethyl gallium (as the Group III source) in the gas phase. GaN crystals can also be grown from the vapor phase using HVPE (hydride vapor phase epitaxy), in which hydrochloric acid reacts with metallic gallium, forming volatile gallium chloride that is carried to a growth surface and reacts with ammonia to form the GaN crystal.

Contamination of the growing crystal layers can be problematic in vapor phase deposition processes. Reactant gases can deposit on the side walls or top surface of the reactor chamber above the substrate or wafer growth surface. Thick deposits on upper surfaces can peel or flake off after they become too thick and fall onto upward facing substrates. The deposits can also react with gases introduced for subsequent layers and can redeposit as particles on the wafers during fabrication, thereby introducing impurities in the layers. In addition, hydrogen carrier gas can partially decompose at the growth temperatures required for such techniques, producing atomic hydrogen species. The atomic hydrogen species can attack the reactor surfaces, especially graphite, but also SiC coated reactor components. Atomic hydrogen species attack of reactor components can also produce particles that dislodge from the reactor, and the particles can fall onto, and thereby contaminate, the growing crystalline layers. Further, dopants introduced into the process to produce intentionally doped materials can adhere to the walls of a reactor. The reactor must be thoroughly cleaned following such a run, or the residual dopants can re-evaporate during subsequent runs and be incorporated into the growing crystal layers.

Achieving crystal layer uniformity can be also problematic. U.S. Patent Application Publication US 2004/0060518 illustrates an apparatus for MOCVD production of semiconductor materials that includes mechanical rotation of the substrate. See also Takayuki Arai et al., *J. Crystal Growth* 170 (1997) 88-91, which reports uniform crystal growth in a MOVPE system that includes mechanical rotation of multiple wafers.

The need for a mechanical feed through into the growth chamber in such systems, however, can result in various problems. The mechanical feed through can undesirably contribute to gas leakage from the reactor. Mechanical rotation can also be difficult to operate under the high processing temperatures typically employed in these systems. In addition, the materials requirements for the components of a mechanically rotated planetary system can lead to rapid wear and dust contamination, and further the tolerance requirements for such components can be difficult to meet.

Another disadvantage of many conventional vapor deposition reactors is that a large and non-uniform boundary layer thickness of hot air can form over the substrates as a result of heating the susceptor. During growth, heat from the susceptor can cause gases to rise and the boundary layer can extend to the top surface of the reactor chamber. Reactant gases are injected into the reactor chamber, typically through a top inlet. When the lower temperature reactor gases encounter the hot gases, heat convection can occur, which can cause turbulence within the reactor. This turbulence can result in non-uniform deposition of materials to the wafer. In addition, convection can contribute to layer contamination, for example, via dopant carryover from one grown layer to the next.

Accordingly, a need exists for an apparatus and method suitable for producing crystalline materials having reduced crystal contamination and substantially uniform crystal layer formation.

BRIEF SUMMARY OF THE INVENTION

The present invention includes an apparatus and method useful in vapor phase deposition of materials. The present invention can be particularly useful in the production of epitaxially grown crystalline layers, including silicon carbide layers, Group III nitride layers, and the like.

In one aspect, the present invention can include a gas driven rotation apparatus, which can be useful with various gas or vapor phase deposition reactors. The gas driven rotation apparatus can include at least one or more rotatable substrate support members configured to support at least one or more substrates having a growth surface oriented in a downwardly facing direction. The apparatus can further include at least one or more drive gas channels adapted to direct the flow of a drive gas so that the drive gas rotates the one or more substrate support members. In various embodiments of this aspect of the invention, the one or more drive gas channels can underlie at least a part of the one or more rotatable substrate support members; alternatively, at least a part of the one or more rotatable substrate support members can underlie the one or more drive gas channels.

Certain embodiments of the invention can further include at least two curved or arcuate shaped drive gas channels in an upper surface of a drive gas flow directing member underlying the substrate support member. In this embodiment of the invention, the curved drive gas channels can be positioned relative to one another to form a non-continuous substantially circular shaped drive gas channel.

The drive gas flow directing member can also include at least one port for introducing a drive gas into the drive gas directing member and a drive gas passage extending from the port through the drive gas flow directing member and having an outlet opening into the drive gas channel. A drive gas can be introduced into the drive gas flow directing member via the port, directed through the drive gas passage, and introduced into the drive gas channel via the outlet opening.

The apparatus can further include at least one or more substrates underlying the one or more substrate support members. The one or more substrates can have a growth surface suitable for supporting the growth of a material from precursor reactant gases deposited thereon. In this embodiment of the invention, the one or more substrates can be placed within the apparatus to orient the growth surface in a downwardly facing position so that crystal growth is in a downward direction.

In another aspect, the present invention can include a gas driven rotation apparatus, also useful with various gas or vapor phase deposition reactors. The apparatus in accordance with this aspect of the invention can include one or more substrates having a growth surface oriented in a downwardly facing position suitable for supporting the growth of a material from precursor reactant gases deposited thereon. In this aspect of the invention, the apparatus can further include a drive gas flow directing member including at least one drive gas channel in an upper surface thereof, which is adapted to direct the flow of a drive gas to rotate the one or more substrates. In various embodiments of this aspect of the invention, at least a part of the drive gas flow directing member can underlie the one or more substrates; alternatively, the one or more substrates can underlie at least a part of the drive gas flow directing member.

The present invention can also provide a method for the gas driven rotation of one or more substrate support members. In this aspect of the invention, a drive gas flow can be directed from one or more drive gas channels under conditions sufficient to rotate one or more substrate support members, which are configured to support one or more substrates having a growth surface oriented in a downwardly facing position. In various embodiments of this aspect of the invention, the one or more drive gas channels can underlie at least a part of the one or more rotatable substrate support members; alternatively, at least a part of the one or more rotatable substrate support members can underlie the one or more drive gas channels. The method can further include the step of placing one or more substrates below the one or more substrate support members with the growth surface thereof oriented in a downwardly facing position. During rotation, reactant gases can contact the downwardly facing growth surface, and a material, for example an epitaxial crystalline layer, can grow thereon in a downward direction.

In another aspect, the present invention can also provide a method for the gas driven rotation of one or more substrates, which can also be useful in a vapor deposition system. In this aspect of the invention, one or more substrates having a growth surface suitable for supporting the growth of a material from precursor gases deposited thereon can be positioned within a suitable apparatus so that the growth surface(s) of the substrate(s) faces downwardly. The method of the invention can include the step of directing a flow of drive gas through one or more drive gas channels located in an upper surface of a drive gas flow directing member so that the one or more substrates are rotated by the flow of drive gas. In various embodiments of this aspect of the invention, at least a part of the drive gas flow directing member can underlie the one or more substrates; alternatively, the one or more substrates can underlie at least a part of the drive gas flow directing member. During rotation, reactant gases can contact the downwardly facing growth surface, and a material, for example an epitaxial crystalline layer, can grow thereon in a downward direction.

The invention can be useful in various vapor deposition techniques, such as but not limited to CVD, MOCVD, OMVPE, HVPE, and the like. The present invention can also be useful in epitaxial lateral overgrowth (ELO) processes, including ELO processes in which relatively thick layers may be useful for full coalescence. In such cases, growth prior to coalescence can be both in lateral and downward directions, and in this invention, the ELO substrate growth surface normal vector can also be oriented in a generally downward direction.

The present invention can reduce many of the problems associated with conventional vapor deposition techniques used in the production of silicon carbide, Group III nitrides, and the like. In contrast to many conventional reactor designs that include a substrate with an upwardly facing growth surface, in the present invention, the substrate growth surface is inverted, e.g., the growth surface is oriented in a generally downward direction, and the growth direction is also generally downward. Inverting the position of the growth surface can reduce many of the problems associated with particle contamination in vapor deposition processes. Positioning the growth surface of the substrate in a downward direction can also reduce many of the problems associated with convection and the resulting turbulence within the reactor, such as non-uniform deposition and layer contamination. In addition, the present invention provides gas driven rotation of a substrate. This can eliminate problems associated with mechanical rotation, such as the need for a mechanical feed through into the growth chamber and the problems associated with the same.

BRIEF DESCRIPTION OF THE DRAWINGS

Having thus described the invention in general terms, reference will now be made to the accompanying drawings, which are not necessarily drawn to scale, and in which:

DETAILED DESCRIPTION OF THE INVENTION

The present invention now will be described more fully hereinafter with reference to the accompanying drawings, in which some, but not all embodiments of the invention are shown. Indeed, this invention may be embodied in many different forms and should not be construed as limited to the embodiments set forth herein; rather, these embodiments are provided so that this disclosure will satisfy applicable legal requirements. Like numbers refer to like elements throughout.

The terminology used herein is for the purpose of describing particular embodiments only and is not intended to be limiting of the invention. As used herein the term "and/or" includes any and all combinations of one or more of the associated listed items. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a member, component, layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Similarly, it will be understood that when an element such as a member, component, layer, region or substrate is referred to as being "attached" or "mounted" to another element, it can be directly attached to the other element or intervening elements may also be present. In contrast, when an element is referred to as being "directly attached" or "directly mounted" to another element, there are no intervening elements present.

It will be understood that relative terms, such as "lower" or "bottom" and "upper" or "top," may be used herein to describe one element's relationship to another element as illustrated in the Figures. Similarly, relative terms such as "underlying," "underneath," "below," and "beneath" may also be used to describe one element's relationship to another element as illustrated in the Figures. It will be understood that relative terms are intended to encompass different orientations of the device in addition to the orientation depicted in the Figures. Furthermore, it will be understood that such terms can be used to describe the relative positions of element(s) to one another, and for example, the terms can refer to an element that is "beneath" or "underlying" another element, with or without other intervening elements therebetween.

Embodiments of the present invention are described herein with reference to various perspectives thereof, including exploded perspective, top, and cross-sectional illustrations that are schematic illustrations of idealized embodiments of the present invention. As such, variations from the shapes of the illustrations as a result, for example, of manufacturing techniques and/or tolerances, are to be expected. It will further be understood that tolerances can be selected to minimize undesired contact between various components of the apparatus. Thus, embodiments of the present invention should not be construed as limited to the particular shapes of regions illustrated herein but are to include deviations in shapes that result, for example, from manufacturing. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

The present invention includes a gas driven rotation apparatus and method useful for the production of materials via the deposition of vapor phase precursors upon an appropriate substrate suitable for promoting the growth of the deposited material. The present invention can be particularly useful for the epitaxial growth of layers of crystalline materials, such as SiC, Group III nitrides, and the like, using any of the various chemical or vapor deposition techniques and/or systems known in the art, including CVD, MOCVD, OMVPE, HVPE, and the like. The present invention can also be useful in epitaxial lateral overgrowth (ELO) techniques, in which epitaxial growth initially occurs in a direction substantially vertical to the surface of a substrate but then proceeds in a direction substantially lateral or horizontal to the surface of the substrate. As used herein, "lateral" or "horizontal" refers to a direction generally parallel to the surface of a substrate, while the term "vertical" means a direction generally orthogonal to the surface of a substrate. The present invention, however, is not limited to the production of crystalline materials. The invention can be generally useful in the production of materials via deposition of precursor materials (typically in the vapor phase) upon an appropriate substrate suitable for promoting the growth of the deposited material, without regard to the specific crystalline structure of the end product. Accordingly, the present invention can be useful in the production of crystalline, semi-crystalline and amorphous materials.

As used herein, the term "Group III nitride" refers to those semiconductor compounds formed between nitrogen and the elements of Group III of the Periodic Table, usually aluminum (Al), gallium (Ga) and/or indium (In). The term also refers to ternary and quaternary compounds such as AlGaN and AlInGaN. As is well understood in the art, the Group III elements can combine with nitrogen to form binary (e.g., GaN), ternary (e.g., AlGaN, AlInN) and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

The general aspects of various vapor deposition techniques for the epitaxial growth of crystalline materials, such as silicon carbide and gallium nitride, have been generally well established for a number of years. Furthermore, those familiar with the growth of crystals, particularly in difficult material systems such as silicon carbide and gallium nitride, will recognize that the details of a given technique can and will vary, usually purposefully, depending upon the relevant circumstances. In addition, modifications to the apparatus and the method of the present invention will be understood by those of ordinary skill in the art upon reading the description herein, and it will also be appreciated that the present invention may be used in other types of reactors and with other types of heating devices and techniques. Accordingly, descriptions given herein are most appropriately given in a general and schematic sense with the recognition that those persons of skill in this art will be able to carry out the invention based on the disclosures herein without undue experimentation.

Figure 1:
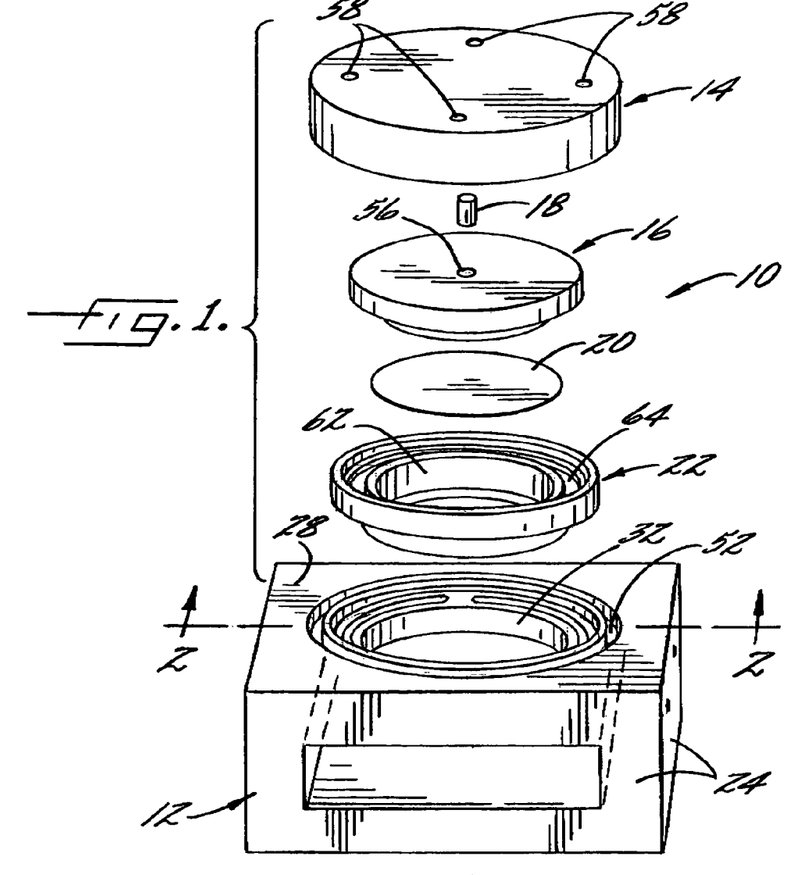
FIG. 1 is an exploded perspective view of a gas driven rotation apparatus in accordance with an exemplary embodiment of the present invention.

FIG. 1 illustrates an exemplary gas driven rotation apparatus 10 in accordance with the present invention that can be useful as a component of a vapor deposition system for the epitaxial growth of crystalline material. The gas driven rotation apparatus 10 may be used, for example, in a cold wall or a hot wall system as is known in the art and which, with the exception of the gas driven rotation apparatus 10, may be of conventional construction and use. For example, a hot wall vapor deposition system, which can be useful with the apparatus illustrated in FIG. 1, generally includes a quartz tube (not shown) defining a through passage and surrounded by an RF coil (not shown). Other heating mechanisms can also be used as alternatives to RF heat, such as resistance heating, radiant heating and the like.

The gas driven rotation apparatus 10 is disposed in the tube, and precursor or reactive gases can be introduced into the tube. Examples of precursor gases for Group III nitrides include Group III alkyls, such as trimethyl gallium, trimethyl aluminum, and trimethyl indium (for the Group III elements) and Group V hydrides (such as ammonia) for the nitrogen component. Examples of precursor gases for SiC materials include silane ($SiH_4$) and propane ($C_3H_8$). Dopant materials can optionally be introduced as well. The reactive gases can be introduced into the reactor with and transported therethrough by a carrier gas, such as purified hydrogen gas ($H_2$). The RF coil inductively heats the gas driven rotation apparatus 10 to provide a hot zone where crystal (i.e., SiC crystal, GaN crystal, etc.) deposition reactions take place.

In one embodiment of the invention, the gas driven rotation apparatus 10 can include a drive gas flow directing member 12 and a substrate support member 16. The substrate support member 16 can be rotatable, i.e., the substrate support member 16 can be positioned or disposed within the apparatus in a manner selected to allow rotation thereof upon introduction of a suitable drive gas into the apparatus. In certain embodiments, the substrate support member 16 can be rotatably attached to a lower surface of an overlying apparatus component using any means suitable for rotatably attaching one such component to another. Suitable attachment means include without limitation spindles, pins, shafts, and the like.

The gas driven apparatus 10 can further include a centering mechanism suitable for centering the substrate support member within the apparatus. The centering mechanism can also define an axis of rotation for the substrate support member. In certain embodiments of the invention, the centering mechanism and the attachment means can be the same component; in alternative embodiments of the invention, the centering mechanism and the attachment means can be separate components of the apparatus.

Figure 2:
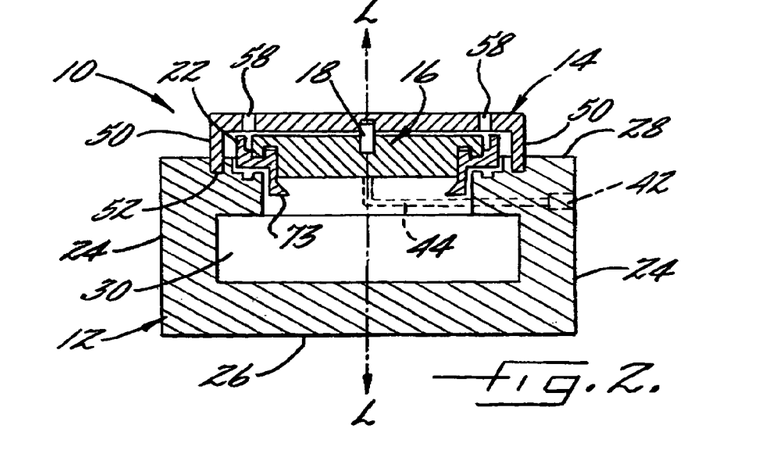
FIG. 2 is a cross sectional view of the gas driven rotation apparatus of FIG. 1 taken along line 2-2 of FIG. 1.

In the embodiment illustrated in FIG. 1, the substrate support member 16 can be attached to the lower surface of a mounting member 14 using a suitable rotational attachment means, such as a spindle 18 defining a rotational axis L-L (schematically illustrated in FIG. 2). The spindle 18 can also center the substrate support member 16 within the apparatus in addition to rotatably connecting the substrate support member 16 to an overlying apparatus component, such as the mounting member 14 as illustrated in FIG. 1.

The spindle 18 can be a separate component as illustrated. Alternatively, the spindle 18 can be an integral part of one of the mounting member 14 or the substrate support member 16. The present invention, however, is not limited to the illustrated embodiment and accordingly can also include embodiments of the gas driven rotation apparatus in which the substrate support member 16 is not attached to the mounting member 14.

Figure 7A:
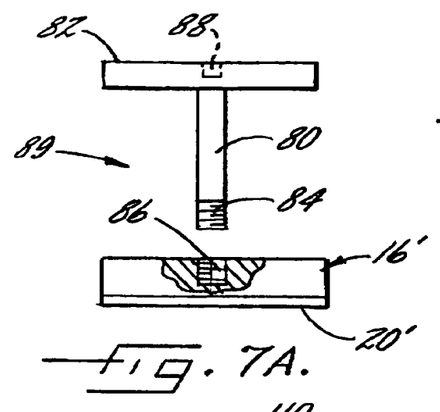
FIGS. 7A and 7B are cross sectional views of alternative embodiments of the substrate support member of the invention.
Figure 7B:
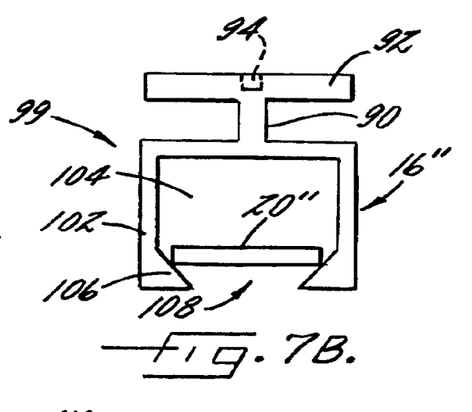

FIGS. 7A and 7B illustrate alternative substrate support members and centering mechanisms in accordance with other exemplary embodiments of the invention. The substrate support members illustrated in FIGS. 7A and B can be useful in certain embodiments of the invention in which one or more substrate support members and/or one or more substrates can be present in the apparatus 10, as discussed in more detail below.

FIG. 7A illustrates an alternative centering mechanism, which can include a shaft 80 extending upwardly from an upper surface of a substrate support member 16' to a lower surface of an overlying component 82 to thereby connect the substrate support member 16' to the overlying component 82. The substrate support member 16', the shaft 80, and the overlying component 82 together are also be referred to herein as a "substrate support assembly" and/or a "substrate centering assembly," as generally indicated by reference number 89 in FIG. 7A.

In certain aspects of this embodiment of the invention, as illustrated, the shaft 80 can be an integral component of the overlying component 82 and can be releasably attached to the substrate support member 16' using any suitable attachment means, such as threads 84 and a corresponding threaded recess 86. Alternatively, the shaft 80 can be an integral component of the substrate support member 16' and can be releasably attached to the overlying component 82, for example, using threads on an end of the shaft distal to the substrate support member and a corresponding threaded recess in the lower surface of the overlying component 82. Still further, the shaft 80 can be an integral component of both the substrate support member 16' and the overlying component 82, or the shaft 80 can be releaseably attached to both of the substrate support member 16' and the overlying component 82 using a suitable attachment mechanism, including opposing threaded shaft end portions and correspondingly threaded recesses as discussed above.

The overlying component 82 can be configured to allow rotatable attachment thereof within the apparatus 10 of the invention. As a non-limiting example, the component 82 can include one or more recesses 88 along an upper surface thereof that can receive a pin or spindle (not illustrated). The pin or spindle can be an integral downwardly extending component of yet another overlying surface, such as the lower surface of a top wall of the apparatus, or the pin or spindle can be a separate component having a lower end portion inserted into the recess 88 and an upper end portion inserted into a counterpart recess (not illustrated) located on a lower surface of an overlying surface.

FIG. 7B illustrates another alternative centering mechanism of the invention, which can include a shaft 90 extending upwardly from an upper surface of a substrate support member 16" to a lower surface of an overlying component 92 to thereby connect the substrate support member 16" to the overlying component 92. Similar to the components of FIG. 7A, the substrate support member 16", the shaft 90, and the overlying component 92 together are also be referred to herein as a "substrate support assembly" and/or a "substrate centering assembly," as generally indicated by reference number 99 in FIG. 7B.

In this embodiment of the invention, the substrate support member 16" can include an upper wall 100 and a side wall 102 extending downwardly from the upper wall 100 defining a recess 104 within the substrate support member 16". The substrate support member 16" can further include means for supporting a substrate 20" within the recess 104. As a non-limiting example, as illustrated, an end 106 of the downwardly extending side wall 104 can be angled along an inner peripheral portion to define an opening 108 that has a smaller diameter than the diameter of the substrate 20" inserted into the substrate support member. The side wall 102 can further have a portion thereof cut away to allow ease of insertion of a substrate 20" into the recess 104 of the substrate support member 16".

As illustrated in FIG. 7B, the shaft 90 can be an integral component of both the substrate support member 16" and the overlying component 92. The present invention is not limited to the illustrated embodiment, and accordingly the shaft 90 can be an integral component of either of the substrate support member 16" and/or the overlying component 92. In certain embodiments of the invention, the shaft 90 can be releaseably attached to the substrate support member 16", the overlying component 92 and/or both, using a suitable attachment mechanism, including a threaded shaft portion and recess with mating threads as discussed above.

Also as discussed above with regard to the component 82 of FIG. 7A, the overlying component 92 of FIG. 7B can be configured to allow rotatable attachment thereof within the apparatus 10 of the invention, using a suitable attachment mechanism. As a non-limiting example, the component 92 can include one or more recesses 94 along an upper surface thereof that can receive a pin or spindle (not illustrated). The pin or spindle can be an integral downwardly extending component of yet another overlying surface, such as the lower surface of a top wall of the apparatus, or the pin or spindle can be a separate component having a lower end portion inserted into the recess 94 and an upper end portion inserted into a counterpart recess (not illustrated) located on a lower surface of an overlying surface.

Turning again to FIG. 1, the gas driven rotation apparatus 10 of the invention can further include at least one substrate 20 underlying the substrate support member 16. The substrate 20 includes at least one growth surface suitable for supporting the growth of a material deposited thereon. For example, the growth surface can be selected to support the growth of epitaxial layers of a crystalline material, including SiC, Group III nitrides such as GaN, and the like, although the present invention is not so limited. Several materials can be suitable for supporting the growth of such layers, including sapphire, silicon, silicon carbide, aluminum gallium nitride, gallium arsenide, and the like, and the skilled artisan can select a substrate material suitable for the growth of a given layer. The substrate is placed within the apparatus to orient the growth surface in a downwardly facing position so that the deposited materials (such one or more crystal layers) grow in a downward direction. The substrate 20 can be substantially disk-shaped as illustrated. The skilled artisan will appreciate that reference to a substantially disc-shaped substrate can include substrates with one or more flats and/or notches as known in the art to assist in orienting the substrate.

FIGS. 7A and 7B illustrate substrates 20' and/or 20". Substrates 20' and/or 20" can be mounted or attached to the substrate support member 16' and/or 16" using any suitable mounting or attachment mechanisms, such as mounting faceplates, spindles, pins, clamps, clips, adhesives, tape, and the like, and including attachment mechanisms that can optionally permit the individual rotation of a substrate.

The gas driven rotation apparatus 10 can also include a member 22, which can be generally disposed between the drive gas flow directing member 12 and the substrate support member 16. The member 22 can hold the substrate support member 16 and the underlying substrate 20 within the apparatus 10.

Variations of the apparatus 10 generally described herein are also contemplated to be within the scope of the present invention. For example, one or more of the components described herein can be present or absent in a given configuration. Accordingly, one or more of the substrate support member 16 and/or the mounting member 14 and/or the member 22 can be eliminated, as discussed in more detail herein.

The drive gas flow directing member 12 can serve as a base member of the apparatus 10, as illustrated. In this embodiment of the invention, the drive gas flow directing member 12 includes side walls 24, a bottom wall 26 and a top wall 28 to form a generally box-like structure defining a cavity or passage 30 therein. In use, precursor gases (also referred to in the art and herein as reactive gases) are introduced into and flow through the passage 30. The precursor gases can be, for example, silane and propane for the production of SiC, or trimethyl gallium and ammonia for the production of GaN. The precursor gases can be introduced into and flow through the passage 30 under conditions selected to promote the epitaxial growth of a crystalline material such as SiC or GaN, respectively, on the lower surface of the substrate 20 in a downward direction.

Although drive gas flow directing member 12 is illustrated as having a bottom wall 26, the present invention is not limited to this construction. Accordingly, in alternative embodiments of the invention, the drive gas flow directing member 12 can have alternative configurations as known in the art which are suitable for confining the precursor gases.

The top wall 28 of the drive gas flow directing member 12 can further include an opening 32, which can be generally centrally located as illustrated. The top wall 28 and opening 32 can be adapted for receiving one or more of other of the components of the apparatus 10 so that the lower surface of the substrate support member 16 and/or the lower surface of the substrate 20 is exposed to the passage 30 and thus to precursor gases introduced into the drive gas flow directing member 12. Each of the members 14, 16, and 22 and substrate 20 of the apparatus 10 can be generally disc shaped, although other shapes can also be useful, and the opening 32 of the top wall 28 of the drive gas flow directing member 12 can be shaped (for example, circular) to accommodate the components of the apparatus.

Figure 3A:
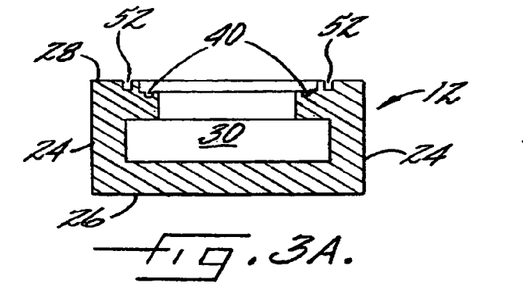
FIG. 3A is a cross sectional view of a drive gas flow directing member forming a part of the gas driven rotation apparatus of FIG. 2.
Figure 3B:
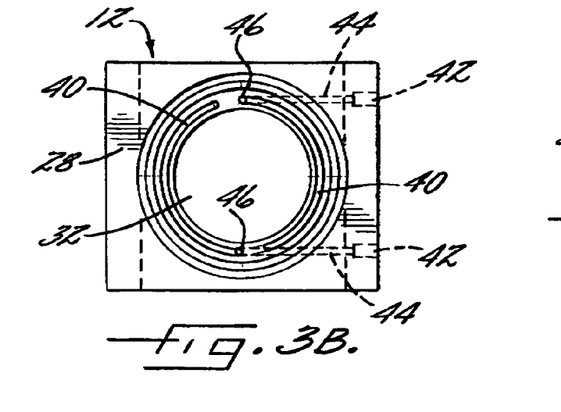
FIG. 3B is a top plan view of the drive gas directing member of FIG. 3A.

As illustrated in FIG. 3B, the drive gas flow directing member 12 can include at least one drive gas channel 40. FIG. 3B illustrates one exemplary embodiment of the invention in which the drive gas flow directing member 12 can include two drive gas channels 40. The present invention, however, is not so limited, and the drive gas flow directing member 12 can include one drive gas channel, three drive gas channels, or more.

The drive gas channels 40 can be adapted to direct the flow of a drive gas introduced into the apparatus 10 in a manner sufficient to rotate the substrate support member 16 and/or the substrate 20 relative to the mounting member 14. In alternative embodiments of the invention in which one or both of the substrate support member 16 and/or the mounting member 14 are absent, the drive gas channels 40 can be adapted to direct the flow of a drive gas introduced into the apparatus in a manner sufficient to rotate the substrate 20. In the various embodiments of the invention, the drive gas channels 40 can also be adapted to direct the flow of a drive gas in a manner sufficient to levitate the substrate support member 16 (when present), the substrate 20 (when present), or both, during rotation. The drive gas channels 40 also can be adapted to direct the flow of the drive gas to exert a force directly on the member 22, when present.

The drive gas flow directing member 12 further can include at least one port 42 for introducing a drive gas into the drive gas flow directing member 12. The drive gas flow directing member 12 further can include at least one drive gas passage 44 that fluidly connects the port 42 and the flow gas channel 40. In particular, the drive gas passage 44 can extend from the port 42 through the drive gas directing member 12 and to an outlet opening 46 into the drive gas channel 40. The outlet opening 46 can be located at one end of the drive gas channel 40.

In operation, a drive gas supply device (not shown) can be connected to the port 42 for fluid communication with the passage 44. The gas supply device is operable to force a flow of pressurized drive gas into the gas supply passage 44. In this manner, drive gas can be introduced into the drive gas flow directing member 12 via the port 42, directed through the passage 44, and introduced into the drive gas channel 40 via the outlet opening 46. The drive gas supply device may be alternatively or additionally connected to a drive gas exhaust outlet 58 (described below) to draw the drive gas from the mounting member 14. Suitable gas supply devices are known in the art and are commercially available. The drive gas is typically inert or non-reactive. As a non-limiting example, the drive gas can be a noble gas, such as argon or helium. Other exemplary drive gases include hydrogen ($H_2$) gas, nitrogen ($N_2$) gas, and the like.

FIG. 3B illustrates one exemplary embodiment of the invention, in which the drive gas flow directing member 12 can include at least two ports 42. In the embodiment of the invention as illustrated, each of the ports 42 can be fluidly connected to different outlet openings 46 of different gas flow channels 40 via separate drive gas passages 44. The present invention, however, is not limited to this arrangement, and as another non-limiting example, the drive gas flow directing member 12 can include a single port fluidly connected to one or more outlet openings into one or more drive gas channels via one or more drive gas passages channels.

The drive gas channels 40 can be formed in an upper surface of the top wall 28 of the drive gas directing member 12. In one embodiment of the invention, the drive gas channels 40 can be curved or arcuate shaped channels positioned relative to one another to form a generally non-continuous substantially circular shaped channel about the opening 32 of the drive gas flow directing member 12. In this embodiment of the invention, each of the arcuate channels 40 typically can include a first end in fluid communication with a drive gas passage 44 via an outlet opening 46, a second end, and a curved portion connecting the first and second ends. Also in this embodiment of the invention, the arcuate channels can be positioned so that the first end of one channel is adjacent the second end of another channel.

The drive gas channels(s) 40 can have other shapes, positions, etc. in accordance with the present invention. Reference is made herein to U.S. Pat. Nos. 4,860,687; 4,961,399; 4,976,217; 5,027,746; 5,108,540; 5,226,383; 6,569,250; and 6,797,069, the entire disclosure of each of which is hereby incorporated by reference, for alternative drive gas channel configurations that may be useful in the present invention.

Figure 3C:
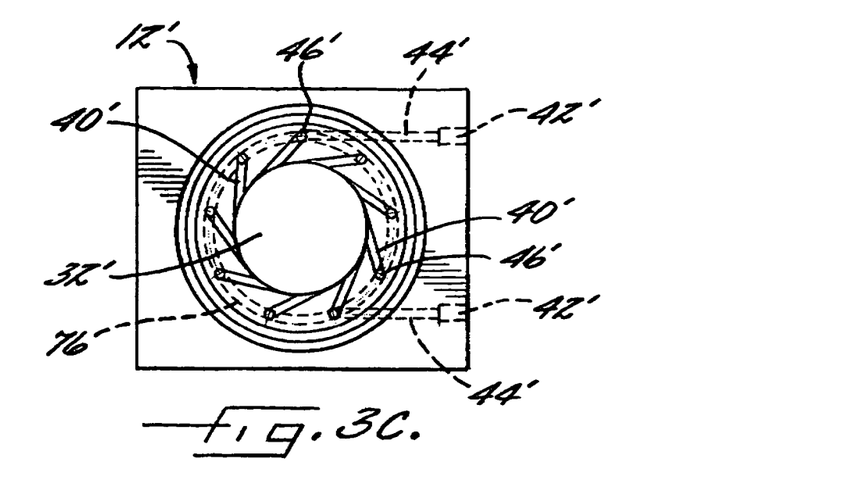
FIG. 3C is a top plan view of an alternative embodiment of the drive gas directing member of the invention.

For example, FIG. 3C is a top plan view of an exemplary alternative embodiment of the invention in which a drive gas directing member 12' can include an opening 32' (which can be generally centrally located in an upper surface thereof as illustrated) and an annular channel 76 surrounding and spaced apart from the opening 32'. This embodiment further can include one, two, or more drive gas channels 40' that extend generally radially outwardly from the opening 32' to the annular channel 76. As illustrated, the drive gas channels 40' can be substantially straight, although in alternatively embodiments the drive gas channels can be curved. The drive gas flow directing member 12' can further include one or more ports 42' fluidly connected to one or more outlet openings 46' located at an inner end of one or more of the channels 40' via one or more drive gas passages 44'.

Figure 3D:
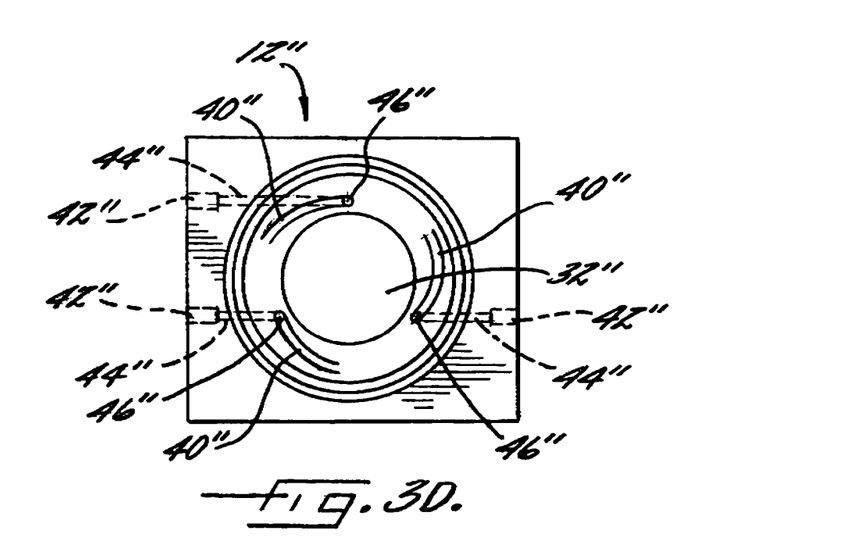
FIG. 3D is a top plan view of another alternative embodiment of the drive gas directing member of the invention.

FIG. 3D is a top plan view of another exemplary embodiment of the invention in which a drive gas directing member 12" can include an opening 32" (also which can be generally centrally located in an upper surface of a drive gas directing member 12") and one, two, or more substantially spiral shaped drive gas channels 40". The drive gas flow directing member 12" can further include one or more ports 42", each of which can be fluidly connected to outlet openings 46" located at one end of one or more of the channels 40" via one or more drive gas passages 44".

Figure 4A:
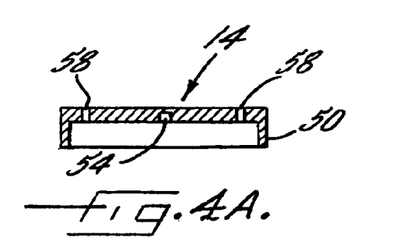
FIG. 4A is a cross sectional view of a mounting member forming a part of the gas driven rotation apparatus of FIG. 2.

Turning again to FIG. 1, the mounting member 14 can function as a lid or cover member for the apparatus 10, and more particularly as a lid or cover for opening 32. As illustrated in FIGS. 2 and 4A, the mounting member 14 can include a downwardly facing annular lip 50 about an outer peripheral portion of a lower surface thereof. In this embodiment of the invention, the drive gas flow directing member 12 can include an annular channel 52 in the upper surface thereof, adapted for receiving the downwardly facing annular lip 50 of the mounting member 14. The mating lip 50 and channel 52 can securely attach the mounting member 14 to the drive gas flow directing member 12 to minimize or eliminate undesired movement of the mounting member. The present invention, however, is not limited to this particular construction to lock the mounting member in place, and accordingly the invention includes other locking mechanisms suitable for minimizing undesired movements of the apparatus components.

As noted above, the substrate support member 16 can underlie the mounting member 14 and can be attached or mounted to the mounting member 14 for rotation about a pin or spindle 18. To mount the substrate support member 16 in accordance with this embodiment of the invention, the mounting member 14 of the apparatus 10 can include a recess 54 in the lower surface thereof and the substrate support member 16 can include a corresponding recess 56 (FIG. 5A) in an upper surface thereof. In the illustrated embodiment, the spindle 18 can include an upper end disposed in the mounting member recess 54 and a lower end disposed in the substrate support member recess 56 to rotatably mount the substrate support member 16 to the mounting member 14.

The central axis of the spindle 18 defines the axis of rotation L-L, which is orthogonal to the lower surface of the substrate support member 16. The recess 56 can be sized so that the substrate support member 16 can rotate freely about the spindle 18 about the axis L-L. The recess 56 also can be sized so that the substrate support member 16 can slide freely vertically up and down along the spindle 18. The spindle 18 in combination with the placement of recesses 54 and 56 can also serve as a centering mechanism to position the substrate support member 16 within the apparatus to avoid collision thereof, or of substrate 20, with surrounding materials during rotation.

Figure 4B:
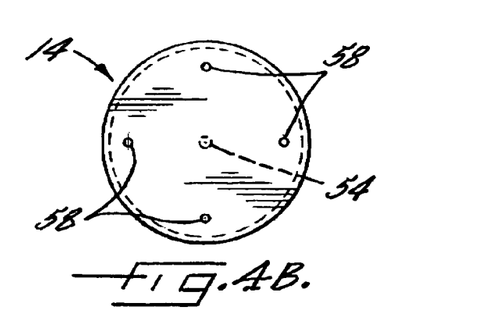
FIG. 4B is a top plan view of the mounting member of FIG. 4A.

The apparatus of the invention can optionally include at least one exhaust port 58 in fluid communication with at least one drive channel 40, such as one or more exhaust ports 58 in the mounting member 14, as illustrated in FIGS. 4A and B. In the illustrated embodiment, in which the mounting member is substantially disc shaped, the plurality of exhaust ports 58 can be distributed about an outer peripheral region of the mounting member 14. The exhaust port(s) can be located in regions or portions of the apparatus other than, or in addition to, the mounting member as illustrated, and further can be present in any of a variety of shapes, sizes, etc., so long as the exhaust ports when present function to assist in the removal of exhaust gases from the apparatus. Further, in certain embodiments of the invention, gases exiting the system may escape or leak from the apparatus without requiring ports. The absence of exhaust ports can also be useful in maintaining a positive pressure in the rotation mechanism area to substantially prevent reaction gases from entering and leaving deposits.

Figure 5A:
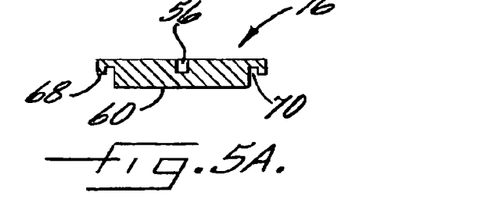
FIG. 5A is a cross sectional view of a substrate support member forming a part of the gas driven rotation apparatus of FIG. 2.
Figure 5B:
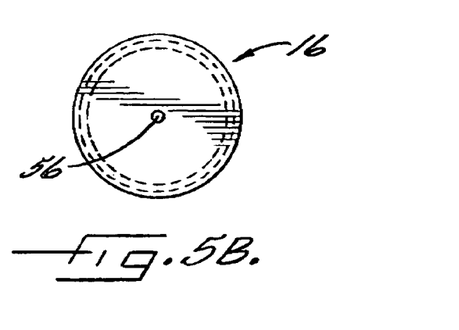
FIG. 5B is a top plan view of the substrate support member of FIG. 5A.

The substrate support member 16 of the apparatus 10 can be substantially disc shaped, as illustrated in FIGS. 5A and 5B. As best illustrated in FIG. 5A, the substrate support member 16 can include a platform 60 projecting downwardly from a lower surface of the substrate support member 16. The platform 60 can have a shape and size (typically disc shaped as well) which is selected to readily position the platform within the opening 32 of the drive gas flow directing member 12. The platform 60 can also have a size and shape sufficient to provide a support surface for the substrate 20. Typically, as illustrated, the platform 60 can have a diameter that is smaller than the diameter of the upper surface of the substrate support member 16, yet the diameter of the platform 60 is large enough to provide an adequate surface for supporting the substrate 20. In alternative embodiments, the lower surface of the substrate support member 16 can have a diameter that is substantially the same as the diameter of the upper surface of the substrate support member.

The substrate 20 can be attached to a lower surface of the substrate support member 16 using any of the means known in the art for attaching a substrate to a surface. For example, the substrate 20 can be adhesively attached to the lower surface of the substrate support member (e.g., to the lower surface of the platform 60). Other useful attachment mechanisms include mounting faceplates, clamps, clips, shafts, tape and the like. In this embodiment of the invention, the substrate support member 16 and the substrate 20 can move together as a single unit in a vertical direction up and down the spindle 18 during rotation.

In an alternative embodiment of the present invention, the substrate 20 can be placed within the apparatus 10 without adhering or attaching the substrate to the substrate support member 16. In this embodiment of the invention, the substrate 20 can be free to move independently of the substrate support member during rotation.

The substrate can have a diameter that is smaller than the diameter of the upper surface of the substrate support member. In addition, the substrate can have a diameter that is substantially the same as or smaller than the diameter of the platform 60. In alternative embodiments, however, the diameter of the upper and lower surfaces of the substrate support member 16 can be substantially the same, and, in addition, the diameters of the upper and lower surfaces of the substrate support member 16 and the substrate 20 can also be substantially the same. This alternative can have the added benefit of maximizing the levitation and/or support surface for the substrate 20 while minimizing wasted space inside of the reactor because it could allow the use of larger and/or more substrates within the apparatus. This alternative can also facilitate the use of various alternative drive gas channel constructions, including constructions similar to the linear channels of FIG. 3C and/or the spiral channels of FIG. 3D.

Figure 8:
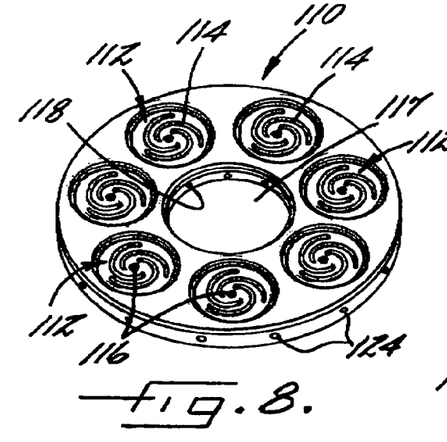
FIG. 8 is a top perspective view of an alternative embodiment of the drive gas directing member of the invention.
Figure 9:
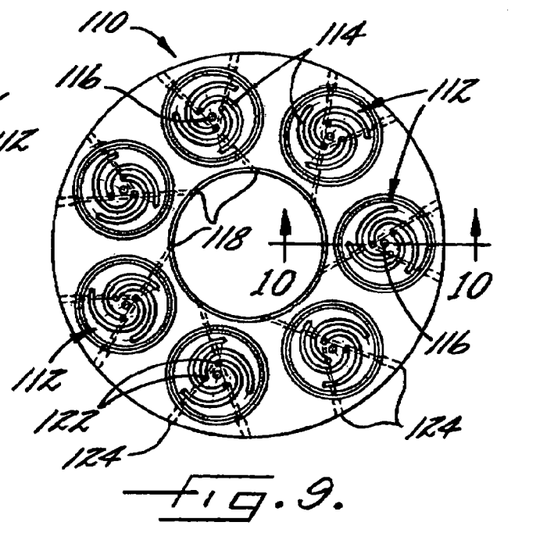
FIG. 9 is a top plan view of the drive gas directing member of FIG. 8.

The gas driven rotation apparatus 10 can also be adapted to provide gas driven rotation of a plurality of substrates and/or substrate support members, for example as illustrated in FIGS. 8, 9, 10, and 11. In the various embodiments of the invention, the apparatus can also be adapted to direct the flow of a drive gas in a manner sufficient to levitate a plurality of substrates and/or substrate support members during rotation. FIG. 8 is a top perspective view of an exemplary drive gas flow directing member 110, and FIG. 9 is a top plan view of the drive gas flow directing member 110 of FIG. 8.

Drive gas flow directing member 110 can include a plurality of groups or arrays 112 of one or more drive gas channels 114 located on an upper surface of the drive gas flow directing member 110. The drive gas channels 114 can be adapted to direct the flow of a drive gas introduced into the apparatus in a manner sufficient to promote the gas driven rotation of at least one, and typically a plurality of, substrates and/or substrate support members. Each group 112 can further include a generally centrally located opening 116. The groups 112 can be substantially identical and symmetrically arranged about the center of the drive gas flow directing member 110, for example, about a generally centrally located opening 117.

FIG. 8 illustrates one exemplary embodiment in which three drive gas channels 114 of a group 112 are arranged to form a generally spiral pattern. The present invention is not limited to the specific drive gas channel shape and/or arrangement as illustrated, and accordingly, the drive gas channels can be curved and/or straight. In addition, fewer or more groups 112 and/or drive gas channels 114 can also be present in accordance with the present invention. Reference is made to U.S. Pat. Nos. 6,569,250; 6,797,069; 4,961,399; and 4,860,687, noted above, for a discussion of various arrays and/or drive gas channel configurations that can be useful in the present invention.

Figure 10:
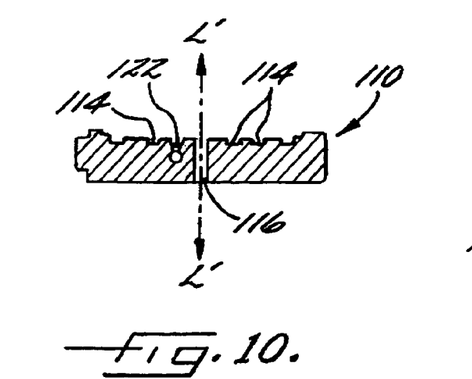
FIG. 10 is a cross sectional view of the drive gas directing member of FIG. 9 taken along line 10-10.

The drive gas flow directing member 110 further can include at least one or more ports 118 for introducing a drive gas into the drive gas flow directing member 110. As illustrated in FIG. 9, the drive gas flow directing member 110 further can include at least one or more drive gas passage(s) 120 that fluidly connect the port(s) 118 and the drive gas channel(s) 114. The drive gas passage(s) 120 can extend from the port(s) 118 through the drive gas directing member 110 and to one or more outlet opening(s) 122 into one or more of the drive gas channel(s) 114. The outlet opening(s) 122 can be located at one end of each of the drive gas channels 114. FIG. 10, which is a cross sectional view of the drive gas directing member 110 of FIG. 9 taken along line 10-10, further illustrates an outlet opening 122 and drive gas channels 114.

FIGS. 8 and 9 further illustrate a gas flow directing member including optional capped or sealed openings 124 about an outer peripheral edge thereof. The openings 124 can be present or absent and when present can be sealed using suitable sealing means.

Figure 11:
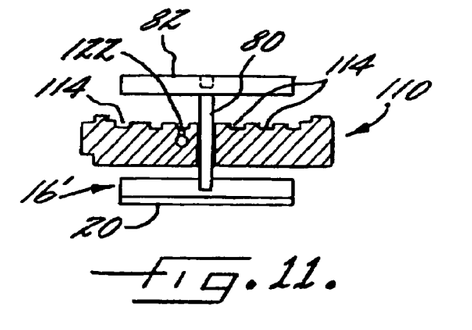
FIG. 11 is a cross sectional view of the drive gas directing member of FIG. 9 taken along line 10-10 in combination with a substrate support member such as illustrated in FIG. 7A.

In this embodiment of the invention, the apparatus can include one or more substrate support member assemblies, such as the assemblies 89 and/or 99 of FIGS. 7A and 7B described above. One or more of the assemblies 89 and/or 99 can be positioned within the apparatus so that at least a part of the assembly, such as component 82 and/or 92, overlies an individual group 112 of drive gas channels 114, as illustrated in FIG. 11. One or more assemblies 89 and/or 99 can also be positioned within the apparatus so that one or more of the substrates 20' and/or 20" underlie a corresponding substrate support member 16' and/or 16" and a corresponding individual group 112 of one or more drive gas channels 114. In this manner, the growth surface of the substrate(s) 20' and/or 20" can be positioned in a downward facing orientation.

In this embodiment of the invention, the substrates can be individually rotatable, i.e., can be placed within the apparatus in a manner selected to permit individual rotation of each substrate 20' and/or 20" about a respective individual rotational axis, designated, for example, at L'-L' in FIG. 10. Accordingly, the apparatus of the invention can rotate each substrate about a respective individual rotational axis, and each of these rotational movements can be driven by a drive gas flow.

Each substrate support member 16' and/or 16" can further be rotatably mounted to a common mounting component in a manner sufficient to substantially align each substrate support member with an individual underlying group 112 of drive gas channels 114. The common mounting component can in turn simultaneously rotate the plurality of substrate support members about a common axis, for example, using mechanical means. Alternatively, the plurality of substrate support member can be rotatably mounted to any other suitable overlying surface of the apparatus, including non-rotating surfaces, such as but not limited to a top wall region of the apparatus. In certain embodiments of the invention, particularly those embodiments in which the common mounting component also rotates, the common mounting component can also be referred to as a main or primary substrate support member, and the plurality of substrate support members underlying the same can be referred to as satellite substrate support members.

In yet another alternative embodiment of the invention, the apparatus 10 can include a plurality of substrates underlying a single substrate support member, such as the substrate support member 16 of FIG. 1. The plurality of substrates can be attached to the lower surface of the substrate support member 16 in a suitable manner, including mounting faceplates, clamps, clips, adhesives, tape, and the like. In this embodiment, the substrates accordingly rotate as the substrate support member 16 rotates.

Figure 6A:
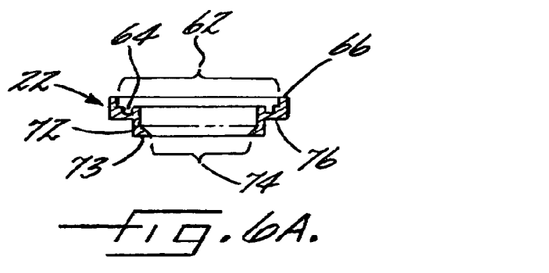
FIG. 6A is a cross sectional view of a member forming a part of the gas driven rotation apparatus of FIG. 2 useful for holding various components within the apparatus.
Figure 6B:
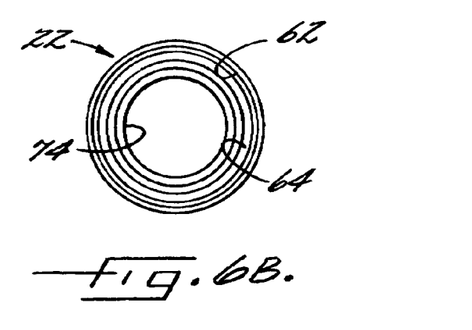
FIG. 6B is a top plan view of the member of FIG. 6A.

The apparatus 10 can optionally include the member 22, such as illustrated in FIGS. 6A and 6B. The member 22 can be adapted to support and/or hold various components within the apparatus 10, such as the substrate support member 16 and/or the substrate 20, and/or to expose a lower surface of the member 16 and/or substrate 20 to the chamber 30 of the drive gas flow directing member 12. The member 22 can also be sufficiently sized so that it is constrained by one or more components to minimize the likelihood of it contacting the inner diameter of drive gas directing member 12 during substrate rotation. In the embodiment of the invention as illustrated, the member 22 can include a substantially centrally located opening 62 in an upper surface thereof. The member 22 can further include an annular channel 64, also on an upper surface of the member 22, which channel 64 surrounds the opening 62. The member 22 can further include an upwardly facing annular lip 66 about an outer peripheral portion of an upper surface thereof, surrounding the annular channel 64. Generally, the annular channel 64 and/or annular lip 66 can be configured (shape, location, etc.) to receive and position the substrate support member 16 within the assembly. As a non-limiting example, as illustrated, the annular channel 64 can be adapted to receive a corresponding downwardly facing annular lip 68 surrounding an annular channel 70 present on a lower surface of the substrate support member 16. The member 22 can have other alternative configurations as well, so long as the member 22 has a shape and size sufficient to position the substrate support member 16 within the assembly as desired. In addition, the member 22 can have a different shape than that illustrated, for example, substantially non-circular. This embodiment of the invention can be useful to prevent lateral displacement of the member 22 relative to other components of the assembly as desired for a given application.

The member 22 can further include a downwardly facing annular lip 72 defining a centrally located opening 74 on a lower surface of the member 22, which lower opening 74 can have a diameter that is smaller than the diameter of the opening 62 on the upper surface of the member 22. The diameter of the lower opening 74 can also be smaller than the diameter of the substrate 20 so that the member 22 can maintain the substrate 20 in a region defined by the lower surface of the substrate support member 16 and a distal end 73 of the annular lip 72. Advantageously, the distal end 73 can be angled as illustrated. The annular lip 72 can be spaced inwardly from the annular lip 66 to define an annular shoulder region 76, which can be adapted to rest upon an upper surface of the drive gas flow directing member 12 and can generally overlie the drive gas channels 40.

FIGS. 6A and 6B illustrate an exemplary member 22 useful in the present invention. The present invention, however, is not limited to this particular construction. The skilled artisan will understand variations of the illustrated embodiment which are also suitable for use in the present invention, including member 22 constructions that are an integral part of other of the components of the gas driven rotation apparatus. The member 22 can also be eliminated, for example, in embodiments of the invention, for example, in which the substrate 20 is attached to the lower surface of the substrate support member 16. In embodiments of the invention in which the member 22 is not present, an outer peripheral portion or extension of the upper surface of the substrate support member 16, which extension has a diameter that is greater than the diameter of the platform 60, can rest directly on the upper surface of the drive gas flow directing member 12 and can generally overlie the drive gas channels 40.

One or more components of the apparatus of the invention, including the drive gas flow directing member 12, the mounting member 14, the substrate support member 16, the spindle 18, and the member 22, can be formed of any of the types of materials known in the art for the construction of components useful in a CVD system. The various components described herein are advantageously formed of high purity graphite with a fully surrounding coating of dense SiC (i.e., impervious and having 0% porosity). Alternatively, one or more of the components, such as the substrate support member 16, can be formed of solid SiC or a solid SiC alloy. In yet another alternative embodiment, one or more of the components can be formed of graphite coated with a high melting point metal or a carbide thereof, such as but not limited to tantalum, tantalum carbide, niobium, niobium carbide, titanium, titanium carbide, zirconium, zirconium carbide, hafnium, hafnium carbide, and the like, as well as mixtures thereof. In other embodiments of the invention, one or more components of the system, such as the substrate support member 16, can be constructed of pyrolytic graphite having a high horizontal conductivity to improve temperature uniformity across a surface thereof. Such materials can be useful in various embodiments of the invention including non-furnace designs. Other materials useful in various embodiments of the invention can include metals such as molybdenum; ceramics such as alumina, aluminum nitride and boron nitride; quartz; and the like, as well as mixtures of these and other materials.

The gas driven rotation apparatus 10 can be assembled in any of a variety of ways, and the present invention is not limited by the order in which the respective components are placed in the assembly relative to one another. As one non-limiting example, as exemplified in FIGS. 1 and 2, the substrate 20 and substrate support member 16 can be mounted in the member 22 so that the substrate is positioned between the member 22 and the substrate support member 16. The spindle 18 can be mounted on substrate support member 16 so that the substrate support member 16 can rotate about the spindle 18. Alternatively, the spindle 18 can be an integral part of substrate support member 16, so long as the substrate support member 16 can rotate about the spindle 18. The resultant sub-assembly of the substrate support member 16 with the spindle 18, the substrate 20 and the member 22 can be mounted on the drive gas flow directing member 12. Mounting member 14 can be mounted on the drive gas flow directing member 12 to provide the desired reaction chamber assembly.

A drive gas supply device connected to port 42 can then be actuated. The drive gas supply device can force the drive gas through the port 42, the passage 44 and the outlet opening 46. The drive gas can pass through the outlet opening 46 and can enter a plenum formed by drive gas channels 40 and the overlying member 22. The drive gas in the plenum can be pressurized until the differential between the drive gas pressure and the ambient pressure (i.e., acting on the upper surface of the substrate support member 16) overcomes the gravitational force on the substrate support member 16, spindle 18, substrate 20, and/or member 22. In this manner, the pressurized drive gas can force the substrate support member 16 and the substrate 20 upwardly. The relative mass of these components (i.e., substrate support member 16, spindle 18, substrate 20, and/or member 22) is typically relatively low to facilitate rotation and/or levitation as appropriate.

Once the substrate support member 16 and the substrate 20 are levitated, the drive gas can flow outwardly from the drive gas channel 40 between the drive gas flow directing member 12 and the member 22 and can be exhausted from the apparatus through the exhaust ports 58 in the mounting member 14. At least a portion, and preferably a predominant portion, of the drive gas can flow from the openings 46 through the drive channels 40.

The drive gas can be continuously forced through the apparatus 10 at a rate and pressure sufficient to maintain the substrate 20 in a levitated position within the opening 32 of the drive gas flow directing member 12. The levitation height may be controlled by selection of the width and depth of the drive channels 40, the pressure of the drive gas between the drive gas flow directing member 12 and the member 22, the drive gas flow rate, and the drive gas composition for each reactor temperature and pressure.

Additionally, the drive gas flow through the drive channels 40 can be viscously coupled to the lower surface of the member 22 and/or the lower surface of the substrate support member 16. Because of the arcuate shape of the drive channels 40, the substrate support member 16 is thereby rotated about the axis L-L by the flowing gas. The rate of rotation may be controlled by selection of the depth, width and length of the drive channels 40, the pressure of the drive gas between the drive gas flow directing member 12 and the member 22, the drive gas flow rate, and the drive gas composition for each reactor temperature and pressure, and the rate of rotation of the substrate support member can be between about 3 and 60 revolutions per minute (rpm).

As another non-limiting example, as exemplified by FIGS. 8-11, one or more substrates 20' and/or 20" as illustrated in FIGS. 7A and 7B can be appropriately mounted to one or more of the substrate support members 16' and/or 16", respectively. The substrate support members 16' and/or 16" can be positioned within the apparatus by inserting the shaft 80 and/or 90 through an opening 116 and thereafter attaching the substrate support member 16 and/or 16" to the shaft to form the assembly 89 and/or 99. The substrates 20' and/or 20" can be positioned vis-à-vis the corresponding substrate support members 16' and/or 16" before or after the assembly 89 and/or 99 is assembled.

In this embodiment of the invention, one or more drive gas supply devices connected to one or more of the ports 118 can be actuated. The drive gas supply device can force a drive gas through the ports 118, the passages 120 and the outlet openings 122. The drive gas can pass through the outlet opening 122 and can enter a plenum formed by drive gas channels 114 and the overlying member 82 and/or 92. The drive gas in the plenum can be pressurized until the differential between the drive gas pressure and the ambient pressure overcomes the gravitational force on the substrate support assembly 89 and/or 99. In this manner, the pressurized drive gas can force the substrate support assembly 89 and/or 99 upwardly. The relative mass of these components is typically relatively low to facilitate rotation and/or levitation as appropriate.

The drive gas can be continuously forced through the apparatus 10 at a rate and pressure sufficient to maintain the substrate support assembly 89 and/or 99 in a levitated position. The levitation height may be controlled by selection of the width and depth of the drive channels 114, the pressure of the drive gas, the drive gas flow rate, and the drive gas composition for each reactor temperature and pressure.

Additionally, the drive gas flow through the drive channels 114 can be viscously coupled to the lower surface of the overlying member 82 and/or 92. Because of the curved shape of the drive channels 114, the substrate support assembly 89 and/or 99 can be thereby rotated about the axis L'-L' by the flowing gas. The rate of rotation may be controlled by selection of the depth, width and length of the drive channels 114, the pressure of the drive gas, the drive gas flow rate, and the drive gas composition for each reactor temperature and pressure, and the rate of rotation of the substrate support assembly can be between about 3 and 60 revolutions per minute (rpm).

The method can further include introducing suitable precursor or reactant gases into the gas driven rotation apparatus 10. Turning again to FIGS. 1 and 2, for example, the precursor or reactant gases can flow through the passage 30 of the drive gas flow directing member 12. During rotation and/or levitation, the reactant gases can contact the downwardly facing growth surface, and epitaxial layers of a crystalline material can grow thereon in a downward direction. In certain embodiments of the invention as exemplified by FIGS. 8-11, the reactant gases can be introduced, for example, into the apparatus in a region above the drive gas flow directing member 110, and the reactant gases can flow downwardly through opening 117 and thereafter flow radially outwardly to the edge of the drive gas flow directing member 110 to contact the growth surfaces of the substrates present within the apparatus.

In the drawings and specification there has been set forth a preferred embodiment of the invention, and although specific terms have been employed, they are used in a generic and descriptive sense only and not for purposes of limitation, the scope of the invention being defined in the claims.

That which is claimed is:

1. A gas driven rotation apparatus, comprising:
   a rotatable substrate support member configured to support a substrate having a growth surface oriented in a downwardly facing position;
   a drive gas flow directing member comprising a passage for the introduction of precursor gases and a drive gas channel, the drive gas channel in an upper surface of the drive gas flow directing member, wherein the drive gas channel is adapted to direct the flow of a drive gas to contact the lower surface of the rotatable substrate support member to rotate and/or lift the rotatable support member about an individual rotational axis; and
   a mounting member having a lower surface overlying the rotatable substrate support member, wherein the mounting member further comprises a plurality of exhaust ports in fluid communication with the drive gas channel and wherein the mounting member and the rotatable substrate support member are rotatably connected.

2. The apparatus of claim 1, wherein the drive gas channel underlies at least a part of the rotatable substrate support member.

3. The apparatus of claim 1, wherein at least a part of the rotatable substrate support member underlies the drive gas channel.

4. The apparatus of claim 1, wherein the drive gas flow directing member underlies at least a part of the rotatable substrate support member.

5. The apparatus of claim 1, wherein at least a part of the rotatable substrate support member underlies the drive gas flow directing member.

6. The apparatus of claim 1, further comprising a substrate underlying at least a part of the substrate support member and having a growth surface oriented in a downwardly facing position for supporting the growth of a material deposited thereon.

7. The apparatus of claim 6, wherein the substrate support member has a first diameter and the substrate has a second diameter that is smaller than the first diameter of the substrate support member.

8. The apparatus of claim 6, wherein the substrate support member has a first diameter and the substrate has a second diameter that is substantially the same as the first diameter of the substrate support member.

9. The apparatus of claim 6, wherein the growth surface is suitable for supporting the epitaxial growth of a crystalline material.

10. The apparatus of claim 6, wherein the growth surface is suitable for supporting the growth of silicon carbide.

11. The apparatus of claim 6, wherein the growth surface is suitable for supporting the growth of a Group III nitride.

12. The apparatus of claim 11, wherein the growth surface is suitable for supporting the growth of gallium nitride.

13. The apparatus of claim 6, wherein the substrate is attached to a lower surface of the substrate support member.

14. The apparatus of claim 1, further comprising a centering mechanism for positioning the substrate support member.

15. The apparatus of claim 14, wherein the centering mechanism defines an axis of rotation of the substrate support member.

16. The apparatus of claim 14, wherein the centering mechanism comprises a shaft extending upwardly from an upper surface of the substrate support member to a lower surface of the mounting member and connecting the substrate support member to the mounting member.

17. The apparatus of claim 14, wherein the mounting member further comprises a lower surface overlying the substrate support member, wherein the mounting member further comprises a recess in the lower surface thereof; the substrate support member comprises a recess in an upper surface thereof; and the centering mechanism comprises a spindle having an upper end disposed in the mounting member recess and a lower end disposed in the substrate support member recess.

18. The apparatus of claim 1, wherein the plurality of exhaust ports are distributed about an outer peripheral region of the mounting member.

19. The apparatus of claim 1, wherein the drive gas flow directing member comprises:
   at least one port for introducing a drive gas into the drive gas directing member; and
   a drive gas passage extending from the port through the drive gas flow directing member and having an outlet opening into the at least one drive gas channel for directing the flow of a drive gas from the port, through the passage and into the drive gas channel.

20. The apparatus of claim 19, wherein the gas flow directing member further comprises a passage and a precursor gas outlet opening in fluid communication with one another for directing the flow of a precursor gas through the drive gas flow directing member and to a lower surface of the substrate support member, wherein the precursor gas outlet opening is separate from the outlet opening for directing the flow of a drive gas into the drive gas channel.

21. The apparatus of claim 19, wherein the drive gas flow directing member comprises at least two drive gas channels.

22. The apparatus of claim 21, wherein the drive gas flow directing member further comprises an opening in an upper surface and wherein the at least two drive gas channels are arcuate channels forming a non-continuous substantially circular shaped channel surrounding and spaced apart from the opening.

23. The apparatus of claim 22, wherein each of the arcuate channels comprises:
   a first end in fluid communication with the drive gas passage outlet opening; a second end; and
   a curved portion connecting said first and second ends.

24. The apparatus of claim 23, wherein the arcuate channels are positioned so that the first end of one channel is adjacent the second end of another channel.

25. The apparatus of claim 21, wherein the drive gas flow directing member further comprises an opening in an upper surface and an annular channel surrounding and spaced apart from the opening and wherein the at least two drive gas channels comprise a plurality of drive gas channels extending generally radially outwardly from the opening to the annular channel.

26. The apparatus of claim 25, wherein the drive gas channels are substantially straight.

27. The apparatus of claim 21, wherein the drive gas flow directing member further comprises an opening in an upper surface and wherein the at least two drive gas channels comprise a plurality of curved drive gas channels extending generally outwardly from the opening.

28. The apparatus of claim 1, wherein the drive gas channel comprises a groove comprising opposing ends connected by a curved portion.

29. The apparatus of claim 28, wherein the drive gas channel forms a semicircular shape.

30. The apparatus of claim 1, wherein the drive gas channel comprises a groove comprising opposing ends connected by a substantially straight portion.

31. The apparatus of claim 1, further comprising a plurality of substrates underlying the substrate support member, wherein each of the substrates has a surface oriented in a downwardly facing position for supporting the growth of a material deposited thereon.

32. The apparatus of claim 1, comprising a plurality of rotatable substrate support members.

33. The apparatus of claim 32, wherein each of the rotatable substrate support members is individually rotatable.

34. The apparatus of claim 33, further comprising a substrate underlying one or more of the rotatable substrate support members, wherein each of the substrates has a surface oriented in a downwardly facing position for supporting the growth of a material deposited thereon.

35. The apparatus of claim 32, further comprising a plurality of drive gas channels adapted to rotate the substrate support members.

36. The apparatus of claim 35, wherein at least a part of each substrate support member underlies a different drive gas channel.

37. The apparatus of claim 32, wherein the plurality of substrate support members comprises a plurality of satellite substrate support members; the apparatus further comprises a main substrate support member having a lower surface overlying the satellite substrate support members; and the satellite substrate support members are rotatably attached to the lower surface of the main substrate support member.

* * * * *